United States Patent
Qiu et al.

(10) Patent No.: US 9,612,686 B2
(45) Date of Patent: Apr. 4, 2017

(54) CAPACITANCE SENSOR WITH NOISE REJECTION

(71) Applicant: FREESCALE SEMICONDUCTOR, INC., Austin, TX (US)

(72) Inventors: Liang Qiu, Tianjin (CN); Bin Feng, Tianjin (CN); Xiaolei Wu, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 25 days.

(21) Appl. No.: 14/946,784

(22) Filed: Nov. 20, 2015

(65) Prior Publication Data

US 2016/0364079 A1   Dec. 15, 2016

(30) Foreign Application Priority Data

Jun. 15, 2015  (CN) .......................... 2015 1 0472054

(51) Int. Cl.
| | |
|---|---|
| *G06F 3/045* | (2006.01) |
| *G06F 3/041* | (2006.01) |
| *G06F 3/044* | (2006.01) |
| *H03K 17/96* | (2006.01) |
| *G05F 3/26* | (2006.01) |

(52) U.S. Cl.
CPC ............ *G06F 3/0418* (2013.01); *G06F 3/044* (2013.01); *H03K 17/962* (2013.01); *G05F 3/262* (2013.01)

(58) Field of Classification Search
CPC ..... G06F 3/0418; G06F 3/044; H03K 17/962; G05F 3/262
See application file for complete search history.

(56) References Cited

U.S. PATENT DOCUMENTS

| | | | |
|---|---|---|---|
| 7,129,714 B2 | 10/2006 | Baxter | |
| 7,598,752 B2 | 10/2009 | Li | |
| 8,154,310 B1 | 4/2012 | Maharyta | |
| 8,344,928 B2 | 1/2013 | Guedon | |
| 8,358,142 B2 | 1/2013 | Maharyta | |
| 8,547,114 B2 | 10/2013 | Kremin | |
| 8,605,037 B2 | 12/2013 | Philipp et al. | |
| 8,614,587 B1 | 12/2013 | Ogirko | |
| 8,659,306 B2 | 2/2014 | Bruwer | |
| 2010/0085322 A1* | 4/2010 | Mamba | G06F 3/044 345/173 |
| 2010/0328262 A1* | 12/2010 | Huang | G06F 3/0416 345/174 |

(Continued)

*Primary Examiner* — Adam R Giesy
(74) *Attorney, Agent, or Firm* — Charles E. Bergere (57) ABSTRACT

In a touch interface, a sensor provides an output signal that is a function of a sensed capacitance. The sensor includes a charger for repetitively applying first and second voltages to charge the sensed capacitance to first and second charge values in first and second phases respectively. A sampler includes a first current mirror for providing first and second sample current signals that are a function of the first and second charge values respectively. An accumulator uses an accumulator signal to provide the output signal. The accumulator repetitively uses the first and second sample current signals differentially to modify a charge on an accumulator capacitor and provide the accumulator signal. The accumulator signal is a progressive function of the sensed capacitance but cancels noise in the first and second sample signals at frequencies less than a repetition rate of operation of the accumulator.

20 Claims, 3 Drawing Sheets

(56) References Cited

U.S. PATENT DOCUMENTS

2013/0162586 A1    6/2013   Erdogan et al.
2014/0145965 A1    5/2014   Liu et al.
2014/0292375 A1*   10/2014   Angelini .................. G06G 7/00
                                                            327/94

\* cited by examiner

CAPACITANCE SENSOR WITH NOISE REJECTION

BACKGROUND

The present invention is directed to integrated circuits and, more particularly, to a capacitance sensor circuit with noise rejection.

Capacitance sensors can be used to detect or measure variation of capacitance at a capacitive touch panel interface. Common examples of capacitive interfaces are touchpads and touchscreens. In a capacitive touch interface, proximity of an electrically conductive object, such as a human finger or conductive stylus, alters electric fields in the touch interface. The capacitance sensor can sense or measure the physical position or movement of the object relative to the interface and provide a corresponding analog or digital code output signal.

Capacitive interfaces have a matrix of capacitance elements. Sensing the variations of capacitance in the interface is subject to perturbations, referred to as noise, which may be due to conduction from a power supply or adjacent circuit elements, or induced by external radiation. The noise may be at frequencies higher or lower than the operating frequency of the capacitance sensor.

It would be advantageous to have a capacitance sensor with a high level of noise rejection, suitable especially for use in noisy environments.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION

Figure 1:
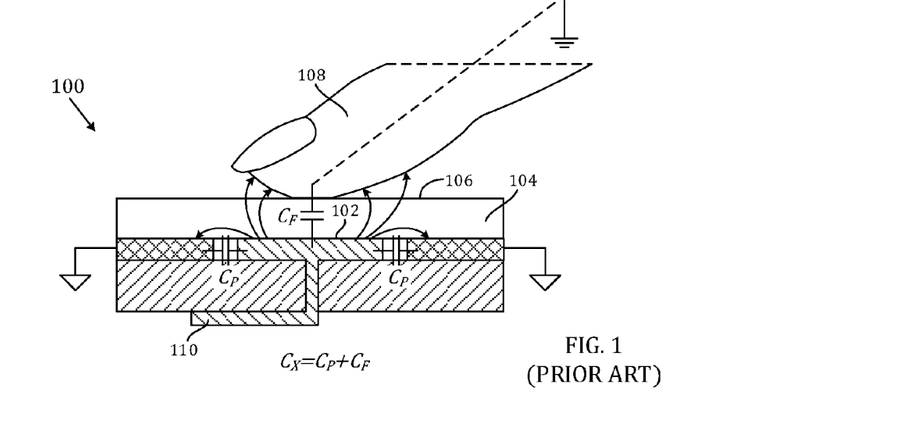
FIG. 1 is a schematic cross-sectional view of a conventional touch panel in which the present invention can be implemented.

FIG. 1 illustrates a capacitive touch panel interface 100 for which the present invention can be implemented. The touch panel 100 may be a touchpad controlling a separate display or a touch screen, where the display screen is integrated under the touch panel and visible through the touch panel 100. A capacitive touch panel typically has an array of capacitance elements such as 102 embedded in an insulator material 104 beneath a surface 106 of the material 104 which the user can touch. The capacitance elements 102 may be formed in a single layer, side by side, in an array of rows and columns. The capacitance detected may be a self-capacitance $C_X$ between the capacitance element and ground, formed by a finger or stylus 108 presenting a capacitance to ground of $C_F$ together with parasitic capacitances $C_P$ to ground as illustrated in FIG. 1. Alternatively, the capacitance detected may be a mutual capacitance between a row capacitance element and a column capacitance element. The proximity of the finger or stylus 108 alters the electrostatic fields, illustrated by double-headed arrows, introducing an additional capacitance and altering the sensed capacitance $C_X=C_F+C_P$. The capacitance elements 102 are connected to the sensor by a connection node 110, illustrated here by a via and a conductor, together with switches Sϕ1, Sϕ2, SϕA, SϕB, (not shown in FIG. 1) that select a specific capacitance element 102 in the array to be sensed and conduct charge and discharge node currents I1, I2, $I_{CX}$ to and from the selected capacitance element 102 of the array through the connection node 110.

Figure 2:
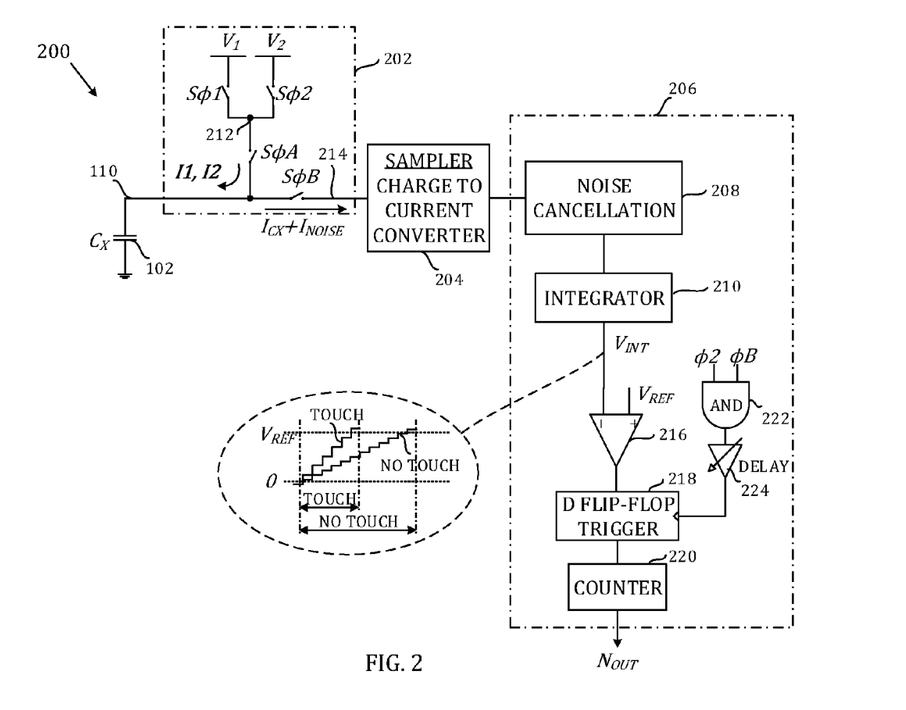
FIG. 2 is a schematic block diagram of a capacitive sensing apparatus in accordance with an embodiment of the invention.
Figure 3:
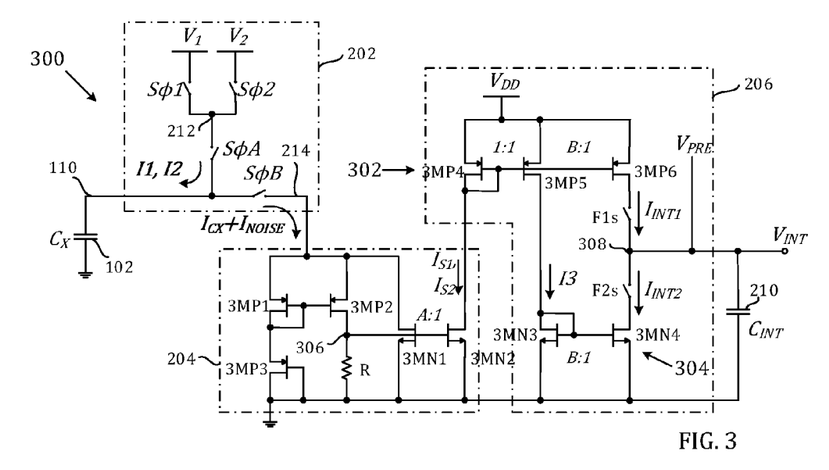
FIG. 3 is a schematic circuit diagram of one embodiment of the capacitive sensing apparatus of FIG. 2.
Figure 5:
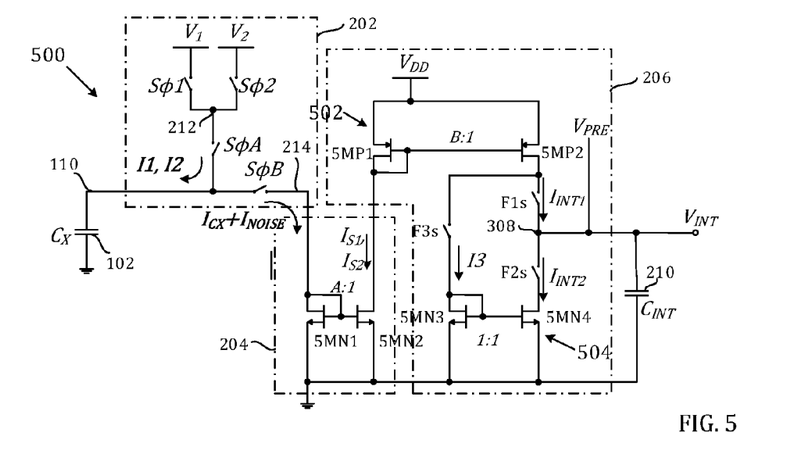
FIG. 5 is a schematic circuit diagram of another embodiment of the capacitive sensing apparatus of FIG. 2.
Figure 6:
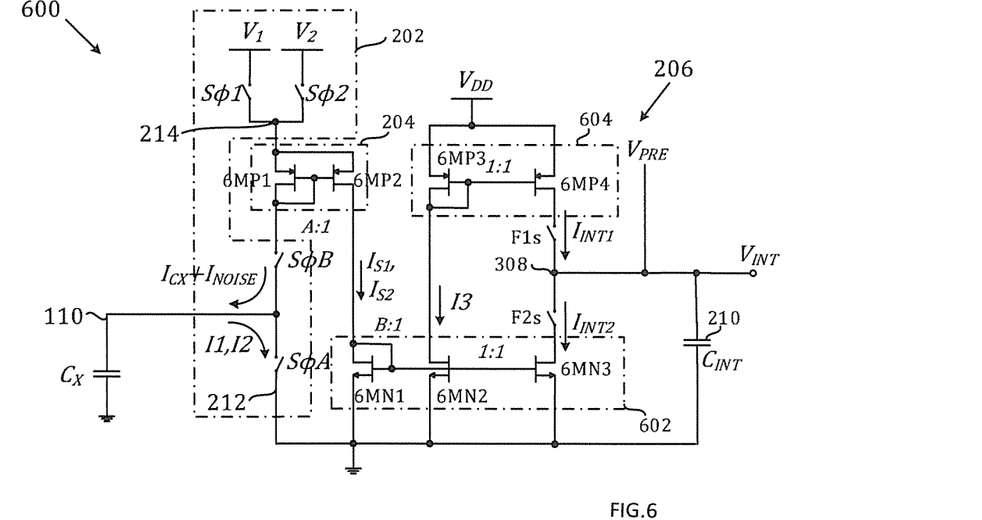
FIG. 6 is a schematic circuit diagram of a capacitive sensing apparatus in accordance with another embodiment of the invention.

FIG. 2 illustrates capacitive sensing apparatus comprising a sensor 200 for providing an output signal $N_{OUT}$ that is a function of a sensed capacitance $C_X$ to which the sensor 200 is connected. FIGS. 3, 5 and 6 illustrate in more detail implementations 300, 500 and 600 of the sensor 200. The sensor 200 is shown sensing a self-capacitance $C_X$ in a touch interface 100, but it will be appreciated that the sensor 200 can be adapted to other technologies of touch interface, including a mutual capacitance touch interface, and more widely to sensing capacitances in other types of apparatus.

Each of the sensors 200, 300, 500, 600 comprises a charger 202 for repetitively applying first and second voltages $V_1, V_2$ to the connection node 110 to charge the sensed capacitance $C_X$ to first and second charge values in first and second phases ϕ1, ϕ2 respectively. The charger 202 repetitively provides the charge and discharge node currents I1, I2, $I_{CX}$ in charging the sensed capacitance through the connection node 110 to first and second charge values in first and second phases respectively.

A sampler 204 includes at least a first current mirror for providing first and second sample current signals $I_{S1}, I_{S2}$ that are a function of the first and second charge values respectively. The first current mirror may use the node currents $I_{CX}$ in providing the first and second sample current signals $I_{S1}, I_{S2}$.

An accumulator 206 performs cancellation of noise in the sample current signals $I_{S1}, I_{S2}$ and provides an accumulator signal $V_{INT}$ that it uses to provide the output signal $N_{OUT}$. The accumulator 206 includes an accumulator capacitor $C_{INT}$. The accumulator 206 repetitively uses the first and second sample current signals $I_{S1}, I_{S2}$ differentially in modifying a charge on the accumulator capacitor $C_{INT}$ and providing the accumulator signal $V_{INT}$. The accumulator signal $V_{INT}$ is a progressive function of the sensed capacitance $C_X$ but tends to cancel a noise in the first and second sample current signals $I_{S1}, I_{S2}$ at frequencies less than a repetition rate of operation of the accumulator.

The sampler 204 can function as a charge transfer circuit, matched to the accumulator 206 through the first current mirror. The accumulator 206 can reject low frequency components in noise $I_{NOISE}$ due to interference, charge injection and offset and can have a narrow band pass response averaging out other components.

The accumulator signal $V_{INT}$ is a function of the charge value on the accumulator capacitor $C_{INT}$ and may be a function of a voltage on the accumulator capacitor $C_{INT}$.

The first current mirror 204 may convert current $I_{CX}$ charging the sensed capacitance $C_X$ to the current signals $I_{S1}$, $I_{S2}$. Alternatively, the first current mirror 204 may convert current $I_{CX}$ discharging the sensed capacitance $C_X$ to the current signals $I_{S1}$, $I_{S2}$.

The accumulator 206 may include at least a second current mirror 302, 502, 602 for controlling the rate at which the accumulator signal $V_{INT}$ varies. The second current mirror 302, 502, 602 may control the rate at which the accumulator signal $V_{INT}$ varies incrementally as a function of the first sample current signal $I_{S1}$, and may control supply of current to a third current mirror 304, 504, 604, which controls the rate at which the accumulator signal $V_{INT}$ varies decrementally as a function of the second sample signal $I_{S2}$.

The sensed capacitance may be a self-capacitance $C_X$ between capacitance elements of an array and ground, the sensed capacitance $C_X$ being a function of proximity of an object to a selected capacitance element. The sensor 200 may include switches SϕA, SϕB for alternately connecting the charger 202 and the sampler 204 through the connection node 110 to the selected capacitance element $C_X$. The sampler 204 may be connected to the connection node 110 to provide the first and second sample current signals $I_{S1}$, $I_{S2}$ while the charger 202 is disconnected from the connection node 110.

Figure 7:
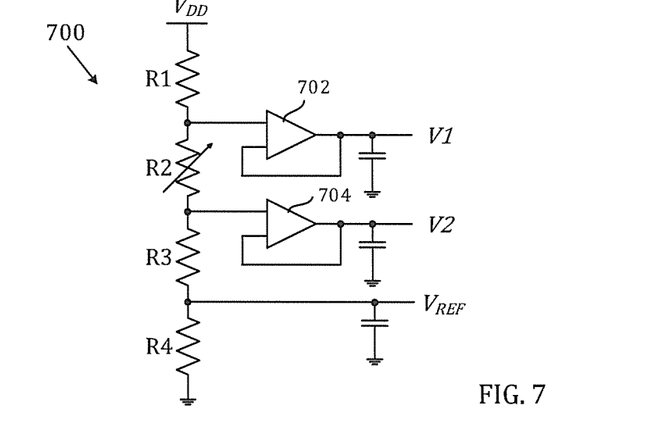
FIG. 7 is a schematic circuit diagram of a voltage generator of a capacitive sensing apparatus of the present invention.

The accumulator 206 may modify the voltage $V_{INT}$ on the accumulator capacitor $C_{INT}$ in repetitive steps. The accumulator 206 may include a comparator 216 for comparing the voltage on the accumulator capacitor $C_{INT}$ with a reference voltage $V_{REF}$ and a counter 220 for counting the number $N_{OUT}$ of steps taken to reach the reference voltage $V_{REF}$. The sensor 204 may include a voltage generator 700 for providing the first and second voltages $V_1$, $V_2$ and the reference voltage $V_{REF}$ as a function of a common voltage supply $V_{DD}$.

In more detail, as shown in FIG. 2, the accumulator 206 has a noise cancellation module 208 and an integrator module 210. The noise cancellation module 208 applies the sample current signals $I_{S1}$, $I_{S2}$ differentially (incrementally and decrementally) to the integrator module 210 to vary the value of the accumulator signal $V_{INT}$ in steps. The accumulator signal $V_{INT}$ is input to the comparator 216 that compares it with a reference voltage $V_{REF}$. The comparator 216 outputs signals when the accumulator signal $V_{INT}$ is equal to the initial voltage and the reference voltage respectively, to a D-flip-flop trigger 218. The D-flip-flop trigger 218 can be triggered by an AND gate 222 that outputs a signal at the conjunction of the second phase signal ϕ2 and the signal ϕA closing the switch SϕA, through a settable delay 224. The counter 220 counts the number of steps $N_{OUT}$ in the accumulator signal $V_{INT}$ at the clock rate (the repetition rate of the measurements) between the initial voltage and the reference voltage $V_{REF}$. The number of steps $N_{OUT}$ at the clock rate (the repetition rate of the operation of the sensor 200) is a measure of the time taken, is a progressive function of the sensed capacitance $C_X$, and is different when a touch event is occurring than when no touch event is occurring. Noise in the first and second sample current signals $I_{S1}$, $I_{S2}$ at frequencies below the repetition rate of the measurements is cancelled out by the noise cancellation module 208 using the first and second sample current signals $I_{S1}$, $I_{S2}$ differentially in providing the accumulator signal $V_{INT}$. Noise in the first and second sample current signals $I_{S1}$, $I_{S2}$ at frequencies above the repetition rate of the measurements averages out in the integrator module 210. Noise in the first and second sample current signals $I_{S1}$, $I_{S2}$ at the same frequency as, or multiples of, the repetition rate of the measurements can be reduced using a conventional technique of spread spectrum clock (SSC), in which the repetition rate of the measurements varies periodically.

The sensors 200, 300, 500 and 600 sense a self-capacitance $C_X$ in a touch interface 100, in which the connection node 110 on only one side of the capacitance $C_X$ is accessible to apply variable voltages, the other side of the capacitance $C_X$ being connected to ground. The switches SϕA, SϕB connect the connection node 110 and the selected capacitance $C_X$ alternately to a node 212, and to the sampler 204 through a node 214. The switches Sϕ1, Sϕ2, connect the node 212 to voltage supplies $V_1$ and $V_2$ during each of the first and second phases ϕ1, ϕ2.

The sensors 300, 500 and 600 have first current mirrors 204, second current mirrors 302, 502 and 602 and third current mirrors 304, 504 and 604, respectively. The current mirrors in the sensors 300, 500 and 600 have metal-oxide-semiconductor field-effect transistors (MOSFETs).

In the sensor 300, the first current mirror 204 has p-type MOSFETs 3MP1, 3MP2 and 3MP3 and a resistor R, and n-type MOSFETs 3MN1 and 3MN2. The sources of the MOSFETs 3MP1 and 3MP2 are connected to the node 214 and their gates are connected together. The drain of the MOSFET 3MP1 is connected to its gate and to the source of the MOSFET 3MP3, whose gate and drain are connected to ground. The drain of the MOSFET 3MP2 is connected to a node 306, which is connected through the resistor R to ground and to the gates of the MOSFETs 3MN1 and 3MN2. The sources of the MOSFETs 3MN1 and 3MN2 are connected to ground. The drain of the MOSFET 3MN1 is connected to the node 214 and the drain of the MOSFET 3MN2 is connected to the second current mirror 302. The dimensions of the MOSFETs 3MP1, 3MP2, 3MP3, 3MN1 and 3MN2 and the value of the resistor R are chosen so that the input node currents $I_{CX}$ from the node 214 are a multiple A of the sample current signals $I_{S1}$, $I_{S2}$ that are output by the drain-source path of the MOSFET 3MN2.

The second current mirror 302 has p-type MOSFETs 3MP4, 3MP5 and 3MP6, whose gates are connected together, and whose sources are connected to a voltage supply $V_{DD}$, common to the accumulator 206 and the voltage generator 700, which supplies the voltages $V_1$, $V_2$ and $V_{REF}$ for the charger 202 and the comparator 216. The drain and gate of the MOSFET 3MP4 are connected together and to the drain of the MOSFET MN2 of the sampler 204. The currents flowing in the drain-source path of the MOSFET 3MP4 are the sample current signals $I_{S1}$, $I_{S2}$ from the sampler 202. The drain of the MOSFET 3MP6 is connected to a node 308 through a switch F1s, synchronized with the switch Sϕ1. The accumulator capacitor $C_{INT}$ is connected between ground and the node 308, at which the accumulator signal $V_{INT}$ appears. The drain of the MOSFET 3MP5 is connected to the drain and gate of an n-type MOSFET 3MN3 in the third current mirror 304, the source of the MOSFET 3MN3 being connected to ground. The third current mirror 304 also has an n-type MOSFET 3MN4 whose gate is connected to the gate of the MOSFET 3MN3, whose source is connected to ground, and whose drain is connected to the node 308 through a switch F2s, synchronized with the switch Sϕ2. The dimensions of the MOSFETs 3MP4 and 3MP5 are equal, so that the source-drain current I3 of the MOSFET 3MP5 is equal to the source-drain current $I_{S1}$, $I_{S2}$ of the MOSFET 3MP4. The dimensions of the MOSFETs 3MP5, 3MP6, 3MN3 and 3MN4 are chosen so that the input currents $I_{S1}$, $I_{S2}$ from the sampler 204 are a multiple B of the currents $I_{INT1}$ and $I_{INT2}$ that the MOSFETs 3MP6 and 3MN4 output when the switches F1s and F2s are closed (conducting) alternately, to charge and discharge the accumulator capacitor $C_{INT}$ repetitively. A pre-charger 800 (FIG. 8) charges the accumulator capacitor $C_{INT}$ initially to a reference value $V_{PRE}$ to ensure proper operation of the third current mirror 304. The multiples A and B are chosen to match the relative sizes of the sensed capacitance $C_X$ and the accumulator capacitance $C_{INT}$.

Figure 4:
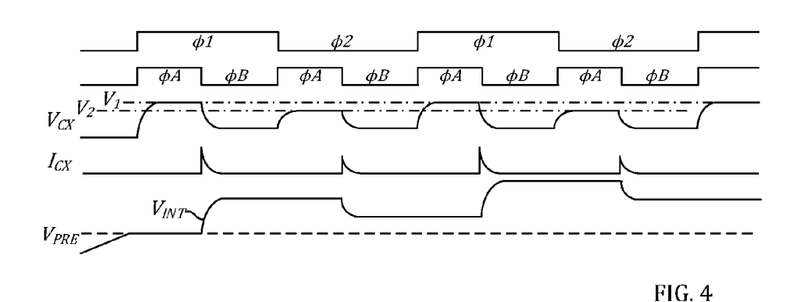
FIG. 4 is a graph against time of signals appearing in operation of the circuit of FIG. 3.

FIG. 4 illustrates signals appearing in operation of the sensor 300 as a function of time. The pre-charger 800 initially charges the accumulator capacitor $C_{INT}$ to the reference value $V_{PRE}$. When the switch SΦ1 applies the voltage $V_1$ to the node 212 and the switch SΦA connects the node 212 to the connection node 110, the selected capacitance $C_X$ charges to the voltage $V_1$. The switch SΦA then opens disconnecting the connection node 110 from the node 212 and the switch SΦB closes, connecting the connection node 110 to the sampler 204. The selected capacitance $C_X$ discharges, and inputs a current $I_{CX}$ that is a function of the charge on the capacitance $C_X$ to the first current mirror 204, together with a component $I_{NOISE}$ due to interference, charge injection and offset, for example. When the switch F1s closes, the third current mirror 304 inputs the corresponding current $I_{INT1}$ to increase the charge on the accumulator capacitor $C_{INT}$.

When the switch SΦ2 applies the voltage $V_2$ to the node 212 and the switch SΦA connects the node 212 to the connection node 110, the selected capacitance $C_X$ charges to the voltage $V_2$. The switch SΦA then opens disconnecting the connection node 110 from the node 212 and the switch SΦB closes, connecting the connection node 110 to the sampler 204. The selected capacitance $C_X$ discharges, and inputs a current $I_{CX}$ that is a function of the charge on the capacitance $C_X$ to the first current mirror 204, together with a component $I_{NOISE}$. When the switch F2s closes, the third current mirror 304 inputs the corresponding current $I_{INT2}$ to decrease the charge on the accumulator capacitor $C_{INT}$.

In this example, the voltage $V_2$ is smaller than the voltage $V_1$ so that the voltage $V_{INT}$ across the accumulator capacitor $C_{INT}$ increases in steps from the initial reference value $V_{PRE}$ until it reaches the reference voltage $V_{REF}$ and is reset for the following cycle. It will be appreciated that alternatively the switches F1s and F2s may be interchanged, and be synchronized with the switches SΦ2 and SΦ1 respectively, so that the currents $I_{INT1}$ and $I_{INT2}$ respectively discharge and charge the accumulator capacitor $C_{INT}$ incrementally. In this alternative (not shown in the drawings), the voltage $V_{INT}$ across the accumulator capacitor $C_{INT}$ decreases in steps from the initial reference value $V_{PRE}$ until it reaches the reference voltage $V_{REF}$.

For components of the interference $I_{NOISE}$ at frequencies substantially below the repetition rate of the first and second phases φ1, φ2 of sensing the capacitance $C_X$, the magnitude of the interference $I_{NOISE}$ changes little, or not at all, between the first phase φ1 and the second phase φ2. In the sensors 200, 300, 500 and 600, the use by the accumulator 206 incrementally of the first sample signal $I_{S1}$ is additive, and its use decrementally of the second sample signal $I_{S2}$ is subtractive in providing the accumulator signal $V_{INT}$. The net effect of a single sense cycle of the two phases φ1, φ2 on the accumulator signal $V_{INT}$ is a progressive function of the sensed capacitance $C_X$, since the sensed capacitance $C_X$ is charged to different first and second charge values, by different first and second voltages $V_1$ and $V_2$, in the first and second phases φ1, φ2. However, the net effect of a single sense cycle tends to cancel components of the interference $V_{NOISE}$ that are at frequencies substantially below the repetition rate of the sensor cycle or that are direct current (DC).

Repetition of the sense cycles tends to average out components of the interference $V_{NOISE}$ at frequencies substantially higher than the repetition rate of the sense cycles except for components at frequencies equal to or multiples of the repetition rate of the cycles. The effect of such high frequency components can be reduced using a SSC technique to vary the repetition rate of the sense cycles.

The accumulator signal $V_{INT}$ varies in steps $\delta V_{INT}$ in each of the sensor cycles as a function of the net charge and discharge current $I_{NET}I_{INT1}-I_{INT2}$ in a cycle. The currents $I_{INT1}$ and $I_{INT2}$ are functions of the charge on the sensed capacitance $C_X$ and of the repetition rate $F_S$ of the sensing cycle, as given by the following equations, where $V_{TH}$ is a threshold voltage in the MOSFETs of the first current mirror 204:

$$I_{NET} = \left[\frac{V_1 - V_{TH}}{1/C_X * F_S} + I_{NOISE}\right] * 1/A * 1/B -$$
$$\left[\frac{V_2 - V_{TH}}{1/C_X * F_S} + I_{NOISE}\right] * 1/A * 1/B$$
$$= \frac{(V_1 - V_2)}{1/C_X * F_S} * 1/A * 1/B$$

$$\delta V_{INT} = I_{NET}/F_S * C_{INT}$$

The output signal $N_{OUT}$ is given by:

$$N_{OUT} = V_{REF}/\delta V_{INT}$$
$$= V_{REF} * F_S * C_{INT}/I_{NET}$$
$$= \frac{V_{REF} * C_{INT} * A * B}{(V_1 - V_2) * C_X}$$

The voltage generator 700 provides the first and second voltages $V_1$, $V_2$ and the reference voltage $V_{REF}$ as a function of a common voltage supply $V_{DD}$, using a voltage divider having resistances R1, R2, R3 and R4 through buffer amplifiers 702 and 704 for the voltages $V_1$, $V_2$. The first and second voltages $V_1$, $V_2$ are provided across R2. The reference voltage $V_{REF}$ is provided by a tap between R3 and R4. The voltages are given by:

$$(V_1 - V_2) = \frac{R2}{R1 + R2 + R3 + R4}$$
$$V_{REF} = \frac{R4}{R1 + R2 + R3 + R4}$$

and the output signal is given by:

$$N_{OUT} = \frac{C_{INT} * R4 * A * B}{C_X * R2}$$

The output signal $N_{OUT}$ is defined by the sensed capacitance $C_X$, the accumulator capacitance $C_{INT}$, the ratio of the resistances R2 and R4, and the scaling of the current mirrors 202, 302 and 304. The value of R2 can be adjusted by trimming the resistor.

In the sensor 500, the first current mirror 204 has n-type MOSFETs 5MN1 and 5MN2, similar to the MOSFETs 3MN1 and 3MN2. However, the connection node 214 is connected directly to input the current $I_{CX}$ to the drain of the MOSFET 5MN1, which is connected to its gate. The second current mirror 502 has p-type MOSFETs 5MP1 and 5MP2, similar to the MOSFETs 3MP4 and 3MP6 of the second current mirror 302. The third current mirror 504 has n-type MOSFETs 5MN3 and 5MN4, similar to the MOSFETs 3MN3 and 3MN4. However, the input current for the third current mirror 504 is taken from the drain of the MOSFET 5MP2, connected to the drain of the MOSFET 5MN3 through a switch F3s, synchronized with the switch F2s. The dimensions of the MOSFETs 5MN1 and 5MN2 are chosen so that the input node currents $I_{CX}$ from the node 214 are a multiple A of the sample current signals $I_{S1}$, $I_{S2}$ that are output by the drain-source path of the MOSFET 5MN2. The dimensions of the MOSFETs 5MP1 and 5MP2 are chosen so that the sample current signals $I_{S1}$, $I_{S2}$ are a multiple B of the output current $I_{INT1}$ of the second current mirror 502. The dimensions of the MOSFETs 5MN3, 5MN4 are chosen so that the output current $I_{INT2}$ of the third current mirror 504 is equal to its input current I3, which is equal in magnitude to the output current $I_{INT1}$ of the second current mirror 502. The operation of the sensor 500 is similar to the sensor 300.

In the sensor 600, the sensed capacitance $C_X$ is discharged by the switch SϕA, connected between the connection node 110 and the node 212 connected to ground. The switch SϕB is connected between the connection node 110 and the drain of a p-type MOSFET 6MP1, whose gate is connected to its drain and to the gate of a p-type MOSFET 6MP2, and whose source is connected to the node 214. The MOSFETs 6MP1 and 6MP2 form the first current mirror 204. The source of the MOSFET 6MP2 is connected to the node 214 and its drain is connected to supply the sample current signals $I_{S1}$ and $I_{S2}$ to the second current mirror 602. The second current mirror 602 has n-type MOSFETs 6MN1, 6MN2 and 6MN3, whose gates are connected together and whose sources are connected to ground. The drain of the MOSFET 6MN1 is connected to the drain of the MOSFET 6MP2 to receive the input currents $I_{S1}$ and $I_{S2}$. The drain of the MOSFET 6MN2 is connected to provide input current I3 for the third current mirror 604. The drain of the MOSFET 6MN3 is connected through the switch F2s to the node 308 and the accumulator capacitor $C_{INT}$. The size of the MOSFET 6MP1 is a multiple A of that of the MOSFET 6MP2. The size of the MOSFET 6MN1 is a multiple B of that of the MOSFET 6MN2. The third current mirror 604 has p-type MOSFETs 6MP3 and 6MP4, similar to the MOSFETs 5MP1 and 5MP2 of the second current mirror 502. The drain of the MOSFET 6MP3 is connected to the drain of the MOSFET 6MN2 and receives the current I3, where $I_{CX}$=I3*A*B. The dimensions of the MOSFETs 6MP3, 6MP4 and 6MN2, 6MN3 are chosen so that the output currents $I_{INT1}$ and $I_{INT2}$ of the second and third current mirrors 602 and 604 are equal to the drain-source current I3 of the MOSFET 6MN2. The operation of the sensor 600 is analogous to the sensors 300 and 500, except that the output currents $I_{INT1}$ and $I_{INT2}$ of the second and third current mirrors 602 and 604 are a multiple of the currents charging the sensed capacitance $C_X$ instead of the discharge currents.

Figure 8:
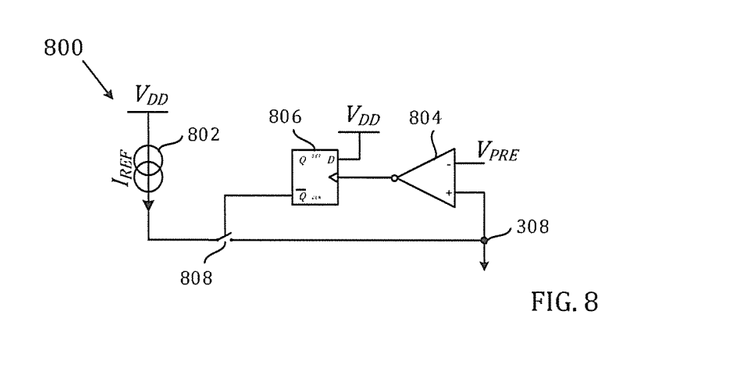
FIG. 8 is a schematic circuit diagram of a pre-charger of a capacitive sensing apparatus of the present invention.

In the example shown in FIG. 8, the pre-charger 800 has a source of a reference current $I_{REF}$, a differential amplifier 804 receiving the voltage $V_{INT}$ of the accumulator capacitance $C_{INT}$ on one input and the pre-charge voltage $V_{PRE}$ on the other input, a D-flip-flop 806 and a switch 808 controlled by the flip-flop 806. The switch 808 is closed to supply the reference current $I_{REF}$ to the accumulator capacitance $C_{INT}$ while its voltage $V_{INT}$ is less than the pre-charge voltage $V_{PRE}$, and opens when the voltage $V_{INT}$ has reached the pre-charge voltage $V_{PRE}$.

The invention may be implemented partially in a non-transitory machine-readable medium containing a computer program for running on a computer system, the program at least including code portions for performing steps of a method according to the invention when run on a programmable apparatus, such as a computer system or enabling a programmable apparatus to perform functions of a device or system according to the invention.

The computer program may be stored internally on computer readable storage medium or transmitted to the computer system via a computer readable transmission medium. All or some of the computer program may be provided on non-transitory computer-readable media permanently, removably or remotely coupled to an information processing system.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate of the IC described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A sensor for providing an output signal that is a function of a sensed capacitance to which the sensor is connected through a connection node, the sensor comprising:
   a charger for repetitively applying first and second voltages to the connection node to charge the sensed capacitance to first and second charge values in first and second phases respectively;
   a sampler including at least a first current mirror for providing first and second sample current signals that are a function of the first and second charge values respectively; and
   an accumulator that comprises an accumulator capacitor for repetitively using the first and second sample current signals differentially in modifying a charge on the accumulator capacitor and providing an accumulator signal;
   wherein the accumulator signal is a progressive function of the sensed capacitance but cancels noise in the first and second sample current signals at frequencies less than a repetition rate of operation of the accumulator, and
   wherein the accumulator uses the accumulator signal to provide the output signal.

2. The sensor of claim 1, wherein the accumulator signal is a function of a voltage on the accumulator capacitor.

3. The sensor of claim 1, wherein the first current mirror converts current charging the sensed capacitance to the sample current signals.

4. The sensor of claim 1, wherein the first current mirror converts current discharging the sensed capacitance to the sample current signals.

5. The sensor of claim 1, wherein the accumulator includes at least a second current mirror for controlling the rate at which the accumulator signal varies.

6. The sensor of claim 5, wherein the second current mirror controls the rate at which the accumulator signal varies incrementally as a function of the first sample current signal, and controls supply of current to a third current mirror which controls the rate at which the accumulator signal varies decrementally as a function of the second sample current signal.

7. The sensor of claim 1 for use with an array of capacitance elements, wherein the sensed capacitance is a self-capacitance between capacitance elements of the array and ground, and wherein the sensor includes switches for alternately connecting the charger and the sampler through the connection node to a selected capacitance element.

8. The sensor of claim 7, wherein the sampler is connected to the connection node to provide the first and second sample current signals while the charger is disconnected from the connection node.

9. The sensor of claim 1, wherein the accumulator modifies the voltage on the accumulator capacitor in repetitive steps, and wherein the accumulator includes a comparator for comparing the voltage on the accumulator capacitor with a reference voltage and a counter for counting the number of steps taken to reach the reference voltage.

10. The sensor of claim 9, further comprising a voltage generator for providing the first and second voltages and the reference voltage as a function of a common voltage supply.

11. A capacitive sensing circuit comprising a sensor and an array of sensed capacitance elements, the sensor comprising:
   switches for conducting charge and discharge node currents to and from a selected capacitance element of the array through a connection node;
   a charger for repetitively providing the charge and discharge node currents in charging the sensed capacitance through the connection node to first and second charge values in first and second phases respectively;
   a sampler including at least a first current mirror for receiving the node currents and for providing first and second sample current signals that are a function of the first and second charge values respectively; and
   an accumulator for repetitively using the first and second sample current signals differentially in providing an accumulator signal;
   wherein the accumulator signal is a progressive function of the sensed capacitance but tends to cancel a noise in the first and second sample current signals at frequencies less than a repetition rate of operation of the accumulator.

12. The circuit of claim 11, wherein the accumulator includes an accumulator capacitor whose charge value is a progressive function of the sample current signals, and wherein the accumulator signal is a function of the charge value on the accumulator capacitor.

13. The circuit of claim 11, wherein the first current mirror converts current charging the sensed capacitance to the sample current signals.

14. The circuit of claim 11, wherein the first current mirror converts current discharging the sensed capacitance to the sample current signals.

15. The circuit of claim 11, wherein the accumulator includes at least a second current mirror for controlling the rate at which the accumulator signal varies.

16. The circuit of claim 15, wherein the second current mirror controls the rate at which the accumulator signal varies incrementally as a function of the first sample current signal, and controls supply of current to a third current mirror that controls the rate at which the accumulator signal varies decrementally as a function of the second sample current signal.

17. The circuit of claim 11, wherein the sensed capacitance is a self-capacitance between capacitance elements of the array and ground, the sensed capacitance being a function of proximity of an object to the selected capacitance element, wherein the sensor includes switches for alternately connecting the charger and the sampler through the connection node to a selected capacitance element.

18. The circuit of claim 17, wherein the sampler is connected to the connection node to provide the first and second sample current signals while the charger is disconnected from the connection node.

19. The circuit of claim 12, wherein the accumulator modifies the voltage on the accumulator capacitor in repetitive steps, and wherein the accumulator includes a comparator for comparing the voltage on the accumulator capacitor with a reference voltage and a counter for counting the number of steps taken to reach the reference voltage.

20. The circuit of claim 19, wherein the sensor includes a voltage generator for providing the first and second voltages and the reference voltage as a function of a common voltage supply.

* * * * *